(12) United States Patent
Ingle (10) Patent No.: US 9,466,797 B2
(45) Date of Patent: Oct. 11, 2016

(54) ORGANIC OPTOELECTRONIC COMPONENT AND METHOD FOR PRODUCING AN ORGANIC OPTOELECTRONIC COMPONENT

(75) Inventor: Andrew Ingle, Allershausen (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 13/260,982

(22) PCT Filed: Mar. 24, 2010

(86) PCT No.: PCT/EP2010/053844
§ 371 (c)(1),
(2), (4) Date: Jan. 26, 2012

(87) PCT Pub. No.: WO2010/112381
PCT Pub. Date: Oct. 7, 2010

(65) Prior Publication Data
US 2012/0132894 A1 May 31, 2012

(30) Foreign Application Priority Data

Mar. 30, 2009 (DE) .................. 10 2009 015 574
May 27, 2009 (DE) .................. 10 2009 022 902

(51) Int. Cl.
*H01L 51/56* (2006.01)
*H01L 51/00* (2006.01)
(Continued)

(52) U.S. Cl.
CPC ........... *H01L 51/0023* (2013.01); *B82Y 20/00* (2013.01); *H01L 27/3239* (2013.01); *H01L 51/5088* (2013.01); *H01L 51/5271* (2013.01)

(58) Field of Classification Search
CPC .............. H01L 51/102; H01L 51/441; H01L 51/0002; H01L 51/442; H01L 51/0053; H01L 51/0018; H01L 51/52; H01L 51/56; H01L 31/04; H01L 31/047; H01L 31/08; H01L 27/14; H01L 27/144; G03F 7/0384; G03F 7/004; G03F 7/0041; G03F 7/0045; G03F 7/26

USPC .......................................................... 257/40
See application file for complete search history.

(56) References Cited

U.S. PATENT DOCUMENTS 6,407,783 B1 * 6/2002 Ohgawara et al. ........... 349/110
6,955,939 B1 * 10/2005 Lyons et al. .................... 438/82
(Continued)

FOREIGN PATENT DOCUMENTS

DE  10 308 515     9/2004
DE  10 2006 000 993  7/2007
(Continued)

OTHER PUBLICATIONS

Koide et al., Hot Microcontact Printing for Patterning ITO Surfaces. Methodology, Morphology, Microstructure, and OLED Charge Injection Barrier Imaging, 2003, Langmuir, 19, 86-93.*
(Continued)

*Primary Examiner* — Julia Slutsker
*Assistant Examiner* — Natalia Gondarenko
(74) *Attorney, Agent, or Firm* — Cozen O'Connor (57) ABSTRACT

In at least one embodiment of the organic optoelectronic component (1), the latter comprises a carrier (2) and a first electrode (11), which is mounted on the carrier (2). Furthermore, the component (1) contains at least one organic layer sequence (3) with at least one organic active layer (33). Furthermore, the component (1) comprises a second electrode (22), such that the organic layer sequence (3) is located between the first electrode (11) and the second electrode (22). At least one dark region (4) and at least one bright region (5) are formed in a lateral direction. In both the dark region (4) and the bright region (5), both the first electrode (11) and the second electrode (22) and also the organic layer sequence (3) are applied to the carrier (2) in places or over the entire surface. A first reflectivity of the dark region (4) differs from a second reflectivity of the bright region (5) by at most 15 percentage points.

4 Claims, 4 Drawing Sheets

(51) Int. Cl.
*B82Y 20/00* (2011.01)
*H01L 27/32* (2006.01)
*H01L 27/14* (2006.01)
*H01L 31/04* (2014.01)
*G03F 7/004* (2006.01)
*H01L 51/50* (2006.01)
*H01L 51/52* (2006.01)

(56) References Cited

U.S. PATENT DOCUMENTS

| | | | |
|---|---|---|---|
| 7,064,483 B2 | 6/2006 | Ottermann et al. | |
| 7,288,511 B2* | 10/2007 | Doyel et al. | 510/412 |
| 7,501,315 B2* | 3/2009 | Heald et al. | 438/128 |
| 2002/0175620 A1 | 11/2002 | Yokoyama | |
| 2004/0082250 A1 | 4/2004 | Haoto | |
| 2004/0178325 A1* | 9/2004 | Forrest et al. | 250/214 R |
| 2004/0227462 A1* | 11/2004 | Utsumi et al. | 313/506 |
| 2007/0020482 A1* | 1/2007 | Allemand | 428/690 |
| 2008/0124824 A1* | 5/2008 | Tsai et al. | 438/29 |
| 2009/0001883 A1 | 1/2009 | Fiebranz | |
| 2009/0082499 A1* | 3/2009 | Nishida et al. | 524/195 |
| 2009/0251646 A1* | 10/2009 | Yoo | 349/106 |

FOREIGN PATENT DOCUMENTS

| | | |
|---|---|---|
| EP | 1 071 145 | 1/2001 |
| EP | 1 835 513 | 9/2007 |
| GB | 2 419 023 | 4/2006 |
| JP | 2001-093314 | 4/2001 |
| JP | 2002-117970 | 4/2002 |
| JP | 2003-257620 | 9/2003 |
| JP | 2004-098351 | 4/2004 |
| JP | 2004-335319 | 11/2004 |
| JP | 2005-215563 | 8/2005 |
| JP | 2005-339893 | 12/2005 |
| JP | 2005-3393833 | 12/2005 |
| JP | 2006-294261 | 10/2006 |
| JP | 2006-318876 | 11/2006 |
| JP | 2007-123377 | 5/2007 |
| JP | 2007-149922 | 6/2007 |
| JP | 2007-323814 | 12/2007 |
| JP | 2008-186815 | 8/2008 |
| WO | WO 98/03043 | 1/1998 |
| WO | WO 03/079732 | 9/2003 |
| WO | WO 2004/013920 | 2/2004 |
| WO | WO 2004/084324 | 9/2004 |
| WO | WO 2005/034586 | 4/2005 |
| WO | WO 2006054475 A1 * | 5/2006 |
| WO | WO 2006/090838 | 8/2006 |
| WO | WO 2006/116584 | 11/2006 |
| WO | WO 2007/096565 | 8/2007 |
| WO | WO 2007/114256 | 10/2007 |

OTHER PUBLICATIONS

Gao et al., Thickness Dependence of Resistivity and Optical Reflectance of ITO Films, 2008, Chinese Phys. Lett., 25, 1380.*
Cusumano, Efficiency enhancement of organic light emitting diodes by NaOH surface treatment of the ITO anode, 2009, Solid-State Electronics, 53, 1056-1058.*
Yamamoto et al., AFM Anodization Lithography on Transparent Conductive Substrates, 2008, Journal of Nanoscience and Nanotechnology, vol. 8, 3838-3842.*
Qvirk, Semiconductor Manufacturing Technology, 2001, Prentice-Hall, Inc., Upper Saddle River, New Jersey 07458, USA.*
UV Flood Exposure Systems http://www.bachur-n-associates/UV Flood Systems.html captured by Internet Archieve Waybackmachine on Nov. 17, 2007, downloaded on Feb. 3, 2013.*
Nuesch et al., A photoelectron spectroscopy study on the indium tin oxide treatment by acids and bases, 1999, Applied Physics Letters vol. 74, No. 6, 880-882.*
Chen et al., Energy Level Alignment at the Anode of Poly(3-hexylthiophene)/Fullerene-Based Solar Cells, 2009, Applied Material & Interfaces, ACS, 741-745.*
Sugiyama et al., Dependence of indium—tin—oxide work function on surface cleaning method as studied by ultraviolet and x-ray photoemission spectroscopies, 2000, J. Appl. Phys., vol. 87, No. 1, pp. 295-298.*

* cited by examiner

ORGANIC OPTOELECTRONIC COMPONENT AND METHOD FOR PRODUCING AN ORGANIC OPTOELECTRONIC COMPONENT

RELATED APPLICATION

This is a U.S. National Stage of International Application No. PCT/EP2010/053844, filed on 24 Mar. 2010 and claims priority on German Application No. 10 2009 015 574.0 filed on 30 Mar. 2009, and No. 10 2009 022 902.7 filed on 27 May 2009, the disclosure content of both of which is hereby incorporated by reference.

FIELD OF THE INVENTION

An organic optoelectronic component is provided. A method of producing an organic optoelectronic component is additionally provided.

SUMMARY OF THE INVENTION

An object of the invention is to provide an organic optoelectronic component which comprises bright regions and dark regions, which are not outwardly distinguishable when the component is not in operation. A further object is to provide a method of producing such an organic component.

According to at least one embodiment of the organic component, the latter comprises a carrier. The carrier serves to support the component mechanically. The component may thus be mechanically stabilised by way of the carrier. The carrier may comprise one of the following materials or consist of one of the following materials: glass, glass film, quartz, plastics, plastics film, metal, metal foil, silicon. The substrate is preferably transparent or translucent throughout or in places to electromagnetic radiation to be emitted by the component.

According to at least one embodiment of the component, a first electrode is mounted on the carrier. The first electrode may be in direct, immediate contact with the carrier. It is likewise possible for at least one interlayer to be mounted in places or over the entire surface between the carrier and the first electrode. The interlayer allows a surface characteristic of the carrier to be adapted to the first electrode. For example, the interlayer serves to promote adhesion between the carrier and the first electrode. The interlayer also allows roughness of a surface of the carrier to be reduced. If an interlayer is present, it is preferably transparent or translucent with regard to the radiation to be emitted by the component.

According to at least one embodiment of the component, the first electrode is transmissive, preferably transparent, to the radiation to be emitted by the component. For example, the first electrode takes the form of an anode. The first electrode then serves as a hole-injecting material. The first electrode consists for example of a transparent conductive oxide. Suitable materials are inter alia zinc oxide, tin oxide, cadmium oxide, titanium oxide, indium oxide, indium-zinc oxide or indium-tin oxide. The material of the first electrode may comprise dopants and be p-doped or n-doped at least in places.

According to at least one embodiment of the component, an organic layer sequence is applied to a major side of the first electrode remote from the carrier. The organic layer sequence comprises at least one organic active layer. The active layer is designed such that when the component is in operation it generates the electromagnetic radiation to be emitted. A wavelength of the radiation lies in the spectral range between 200 nm and 3000 nm, preferably between 350 nm and 850 nm. Visible radiation in particular is generated in the active layer when in operation.

According to at least one embodiment of the component, the organic layer sequence comprises at least one charge carrier transport layer and/or one charge carrier injection layer and/or one charge carrier stop layer in addition to the at least one organic active layer.

According to at least one embodiment of the component, the organic active layer comprises at least one organic polymer, one organic oligomer, one organic monomer, small organic non-polymeric molecules or a combination thereof.

According to at least one embodiment of the component, a second electrode is applied to a side of the organic layer sequence remote from the carrier. The organic layer sequence is thus located between the first electrode and the second electrode. The second electrode takes the form of a cathode, for example. In particular, the second electrode comprises one of the following materials or consists of such a material: aluminium, barium, indium, silver, gold, magnesium, calcium, lithium, steel. The second electrode is preferably opaque to and/or reflective for the radiation generated in the organic layer sequence. It is possible for the second electrode, in addition to the carrier, to stabilise the component mechanically.

According to at least one embodiment of the component, the latter comprises a radiation passage face. The radiation passage face may be a boundary face of the component, through which the radiation generated in the active layer or some or a majority of this radiation leaves the component. For example, the radiation passage face is formed by a major side of the carrier remote from the organic layer sequence. The radiation passage face may also take the form of a coating with for example an antireflective effect on this major side of the carrier.

According to at least one embodiment of the organic component, at least one dark region and at least one bright region are formed in a lateral direction. Lateral means in particular along at least one main direction of extension of the organic component. The bright region is here a region of the radiation passage face of the component in which a greater radiant power is emitted per unit area than in the dark region. Thus, in plan view of the component in particular the bright region appears brighter than the dark region when the component is in operation. The component preferably comprises a plurality of bright regions and a plurality of dark regions. The bright regions and the dark regions are here in each case continuous areas of the radiation passage face of the component.

According to at least one embodiment of the component, the first and the second electrode and the organic layer sequence are applied to the carrier throughout or in places both in the at least one dark region and in the at least one bright region. In other words, both the bright region and the dark region then comprise the same components with regard to the electrodes and the organic layer sequence. For example, the second electrode and the organic layer sequence are made identically both in the bright region and in the dark region, within the bounds of manufacturing tolerances. For example, the first electrode is likewise a layer extending in particular continuously over the dark region and the bright region with a thickness which is preferably constant within the bounds of manufacturing tolerances, i.e. the patterning of the radiation passage face into bright and dark regions is not achieved by shaping or geometric configuration of the first electrode, the second electrode and the organic layer sequence.

According to at least one embodiment of the organic component, the latter exhibits a first reflectivity of the dark region. For example, the first reflectivity is a reflectivity of the radiation passage face in the dark region. The component accordingly exhibits a second reflectivity of the bright region, which for example is a reflectivity of the radiation passage face in the bright region.

According to at least one embodiment of the organic component, the first reflectivity of the dark region differs from the second reflectivity of the bright region by at most 15 percentage points, preferably by at most 10 percentage points, in particular by at most 5 percentage points. In other words, a reflectivity at the radiation passage face in the bright region and a reflectivity at the radiation passage face in the dark region are virtually identical or, preferably, identical within the bounds of manufacturing tolerances.

The reflectivity is for example in each case the quotient of an incident radiant power and a reflected, emergent radiant power. To determine reflectivity, the light output which impinges on the radiation passage face is thus for example measured and compared with a light output reflected by the radiation passage face. If the first reflectivity of the dark region amounts to 15% for example, the second reflectivity of the bright region is preferably between 10% and 20% inclusive.

In at least one embodiment of the organic optoelectronic component, the latter comprises a carrier and a first electrode, which is mounted on the carrier. Furthermore, the component contains at least one organic layer sequence with at least one organic active layer. Furthermore, the component comprises a second electrode, such that the organic layer sequence is located between the first electrode and the second electrode. At least one dark region and at least one bright region are formed in a lateral direction. In both the dark region and the bright region, both the first electrode and the second electrode and also the organic layer sequence are applied to the carrier in places or over the entire surface. A first reflectivity of the dark region differs from a second reflectivity of the bright region by at most 15 percentage points.

By way of the at least one bright region and the at least one dark region, a pattern and/or a inscription and/or a symbol may be displayed when the component is in operation. The bright regions form bright, luminous regions for instance of the pattern. A contrast to the bright regions is formed by means of the non-luminous or more weakly luminous dark regions. Because the first reflectivity of the dark region and the second reflectivity of the bright region are virtually identical, it is possible for instance for the pattern displayed when the component is in operation not to be visible apart from when the component is in operation. In other words, when the component is not in operation the radiation passage face of the component in particular may appear homogeneous and unpatterned when the component is viewed from outside with the naked eye. That is to say that when the component is not in operation the pattern cannot be discerned by an observer.

According to at least one embodiment of the component, a monolayer with self-assembling molecules is applied in the at least one dark region to a major face of the first electrode remote from the carrier. The monolayer is applied in particular only in the dark region, such that the bright region lacks the monolayer. The entire dark region is preferably covered by the monolayer. In other words, dark regions may be solely where the monolayer is produced on the organic layer sequence, in particular in a direction perpendicular to the major face of the first electrode. Monolayer preferably means that the layer thickness of the molecules on the major side amounts to precisely just one molecule. Accordingly, preferably no identical molecules are located one above the other in the monolayer.

The monolayer is thus located between the first electrode and the organic layer sequence. The monolayer may for example be applied to the first electrode using a printing process. An achievable feature size for the monolayer amounts, in a lateral direction, to for example 100 µm, in particular 25 µm. The feature size is preferably only limited by the spatial resolution of a printing method used for example to produce the monolayer. In other words, very fine monolayer patterns may be produced.

According to at least one embodiment of the organic component, the monolayer is colourless. In other words, an absorption coefficient and/or a reflection coefficient of the monolayer is virtually independent of the wavelength in the visible spectral range. For example, the absorption coefficient and/or the reflection coefficient is constant in the spectral range between 470 nm and 650 nm to a difference of 10 percentage points, in particular to a difference of 3 percentage points. For example the absorption coefficient is between 0% and 10% inclusive, in particular between 0.01% and 3% inclusive.

According to at least one embodiment of the organic component, the monolayer is electrically insulating. In a direction perpendicular to the first electrode, therefore, no current flows through the monolayer when the component is in operation. The organic layer sequence exhibiting negligible electrical transverse conductivity, radiation in the organic layer sequence is produced only in those regions in which no monolayer has been applied. The monolayer preferably comprises a breakdown voltage of at least 1 MV/cm, in particular of at least 30 MV/cm, in a direction perpendicular to the first electrode.

According to at least one embodiment of the organic component, the thickness of the monolayer, in a direction perpendicular to the first electrode, is between 0.5 nm and 5.0 nm inclusive, in particular between 1.0 nm and 3.0 nm inclusive. The monolayer is thus very thin compared to a wavelength of a radiation generated in the organic layer sequence. The monolayer therefore has no or only a negligible effect on the optical characteristics of the component, in particular on the optical refractive index.

According to at least one embodiment of the organic component, the monolayer is formed with molecules or consists of those molecules which comprise long aliphatic chains and include a phosphate group, silicate group, carbonyl acid group, trichlorosilane group or a similar group as head group. Alternatively or in addition, the molecules of the monolayer may also contain large groups with a conjugated ring system, such as benzene or cyclopentane. Examples of such molecules are 2[(trimethyloxysily)ethyl]benzene or 3-[2-(trimethyloxysily)ethyl]pyridine.

According to at least one embodiment of the organic component, the carrier comprises a roughening in the dark region on a side facing the layer sequence. In other words, the side of the carrier facing the layer sequence is virtually smooth in the bright region and purposefully rough in the dark region. The roughening is thus located between the carrier and the first electrode.

According to at least one embodiment of the organic component, the radiation passage face is identical in nature, within the bounds of manufacturing tolerances, in the bright region and in the dark region, for example with regard to roughness. In other words, the side of the carrier remote from the organic layer sequence is in particular not patterned.

According to at least one embodiment of the organic component, the average roughness of the roughening amounts to between 5 nm and 1 µm inclusive, in particular between 20 nm and 500 nm inclusive. The roughening thus exhibits in particular an average roughness which is less than or equal to a wavelength of the radiation generated in the organic layer sequence.

According to at least one embodiment of the organic component, the roughening and/or the dark region comprises a lateral feature size of at least 1 mm, in particular of at least 3 mm. In other words, the roughening, and thus preferably also the dark region, extends by at least the stated values in one or two directions. The roughening may thus be of an extensive nature.

According to at least one embodiment of the organic component, the roughening of the carrier is formed in the dark region by groove- or channel-like structures, which have an average depth corresponding to the average roughness. Groove-like may mean that the average length exceeds the average width of the structures by at least ten times.

According to at least one embodiment of the organic component, an interlayer is located between the carrier and the first electrode. The interlayer preferably has a refractive index which differs from that of the carrier by at most 0.1, in particular by at most 0.05. If the refractive index of the carrier amounts for example to 1.50, the refractive index of the interlayer is preferably between 1.45 and 1.55. For example, the interlayer is an oxide layer, in particular a silicon dioxide layer.

According to at least one embodiment of the organic component, the thickness of the interlayer, in a direction perpendicular to the first electrode, is between 10 nm and 200 nm inclusive, in particular between 15 nm and 40 nm inclusive. If the interlayer is mounted over the roughening, a side of the interlayer remote from the carrier is preferably smoother than the carrier in the region of the roughening. The average thickness of the interlayer may lie in the range of the average roughness of the roughening of the carrier.

According to at least one embodiment of the organic component, the average radiant power per unit area of the at least one dark region amounts to at most 60%, in particular at most 45%, of the average radiant power per unit area of the at least one bright region. For example, virtually no radiant power is emitted in the dark region. It is likewise possible for the radiant power per unit area of the dark region to amount to between 1% and 60% inclusive of that of the bright region, preferably to between 2% and 45% inclusive, in particular between 4% and 30% inclusive.

According to at least one embodiment of the organic component, the carrier is formed with a glass, the first electrode with a conductive transparent oxide and the second electrode with a metal or they consist of the stated materials. The radiation generated in the organic layer sequence thus passes through the carrier and is emitted in particular at a major side of the carrier remote from the organic layer sequence.

According to at least one embodiment of the organic component, a major face of the first electrode, which is remote from the carrier, exhibits a higher work function in the at least one dark region than in the at least one bright region. The work function is for example the minimum energy required to convey a charge carrier such as an electron from a point inside the first electrode to a point outside the surface of the first electrode. The work function of the first electrode differs in the dark region from the work function in the bright region for example by at least 0.10 eV, preferably by at least 0.25 eV, in particular by at least 0.40 eV. An absolute value of the work function is here preferably between 4.0 eV and 5.0 eV inclusive, in particular around 4.5 eV. The work function is preferably not modified by applying a separate coating, for example with a thin, in particular single-ply layer of organic molecules. In other words, the first electrode is then free of such a separate coating which influences the work function.

A method of producing an optoelectronic organic component is additionally provided. For example, the method may be used to produce an optoelectronic organic component as described in relation to one or more of the above-stated embodiments. Features of the organic optoelectronic component are therefore also disclosed for the method described herein and vice versa.

In at least one embodiment of the method, the latter comprises the following steps:
  providing a carrier with a first electrode,
  applying a photosensitive material to the first electrode and exposing it apart from in a zone,
  removing the photosensitive material, wherein the thickness of the first electrode remains unchanged within the bounds of manufacturing tolerances,
  applying a further photosensitive material to the first electrode and exposing it apart from in a sub-region,
  removing the further photosensitive material, and
  producing an organic layer sequence with at least one organic active layer and a second electrode at least on the first electrode. In this case, a work function at a major face of the first electrode remote from the carrier is preferably decreased in at least one overlap zone, in which the zone and the sub-region overlap, compared with the other regions of the first electrode.

In other words, in a method step a photoresist is for instance applied to the first electrode, and the photoresist is exposed at least in places. The photoresist is then removed for example after development, wherein the first electrode does not need to be patterned. In another step of the method, a further photosensitive material, for instance a photoresist, is applied to the first electrode, exposed and in particular also developed. The first electrode may optionally be patterned by removal of the second photoresist at least in places. It is likewise possible for the second photoresist to be removed again without the first electrode being patterned by the removal of material.

The at least one bright region is then formed by a region of the first electrode in which photosensitive material has twice been applied and removed again and which has not undergone any exposure of the photosensitive material. It is at the same time assumed that by applying the photosensitive, unexposed material twice, removing it twice and preferably also developing it twice, the work function of the first electrode may be decreased. The decreased work function in turn results in the thus treated region appearing brighter when the component produced is in operation.

According to at least one embodiment of the method, the first electrode is formed with indium-tin oxide or consists of indium-tin oxide. Furthermore, the photosensitive material and/or the further photosensitive material is removed by ashing with an $O_2$ plasma and/or by rinsing with a solvent.

According to at least one embodiment of the method, in an additional method step between the step of exposing the further photosensitive material and the step of removing the further photosensitive material a material of the first electrode is completely or partly removed apart from in the sub-region in which the further photosensitive material was not exposed. In other words, the first electrode is patterned by means of a mask formed by the further photosensitive material, wherein the patterning takes place by material removal, for example removal by etching, of the first electrode apart from in the sub-region.

According to at least one embodiment of the method, at least one bright region is formed by the overlap region in which the sub-region and the zone overlap. The bright region thus constitutes at least one region of the first electrode,
- in which a photosensitive material has been applied twice to the first electrode,
- which has not been exposed,
- in which the photosensitive materials have in each case been removed again, and
- in which the photosensitive materials have preferably in each case also been developed.

According to at least one embodiment of the method, at least one dark region is formed in the regions of the first electrode which do not belong to the sub-region. The at least one bright region and the at least one dark region do not therefore differ in the thickness or material composition of the first electrode, but rather preferably merely in a work function at a major side of the first electrode remote from the carrier.

According to at least one embodiment of the method, the first electrode is formed of indium-tin oxide, ITO for short, or consists of ITO. Exposure of the photosensitive material and the further photosensitive material takes place at wavelengths of between 240 nm and 380 nm inclusive. In each case a positive photoresist is preferably used as the photosensitive material. Development of both the photosensitive material and the further photosensitive material preferably takes place in particular in the bright region.

According to at least one embodiment of the method, the photosensitive materials are removed completely. In other words, the finished, organic component is then free of the photosensitive materials.

Some of the fields of application in which organic components described herein may be used are for instance the backlighting of displays or display means. Furthermore, optoelectronic components described herein may be used in lighting devices for projection purposes, in floodlights or spotlights or for general lighting.

A component described herein and a method described herein will be explained in greater detail below with reference to the drawings and with the aid of exemplary embodiments. Elements which are the same in the individual figures are indicated with the same reference numerals. The relationships between the elements are not shown to scale, however, but rather individual elements may be shown exaggeratedly large to assist in understanding.

DETAILED DESCRIPTION OF THE DRAWINGS

Figure 1:
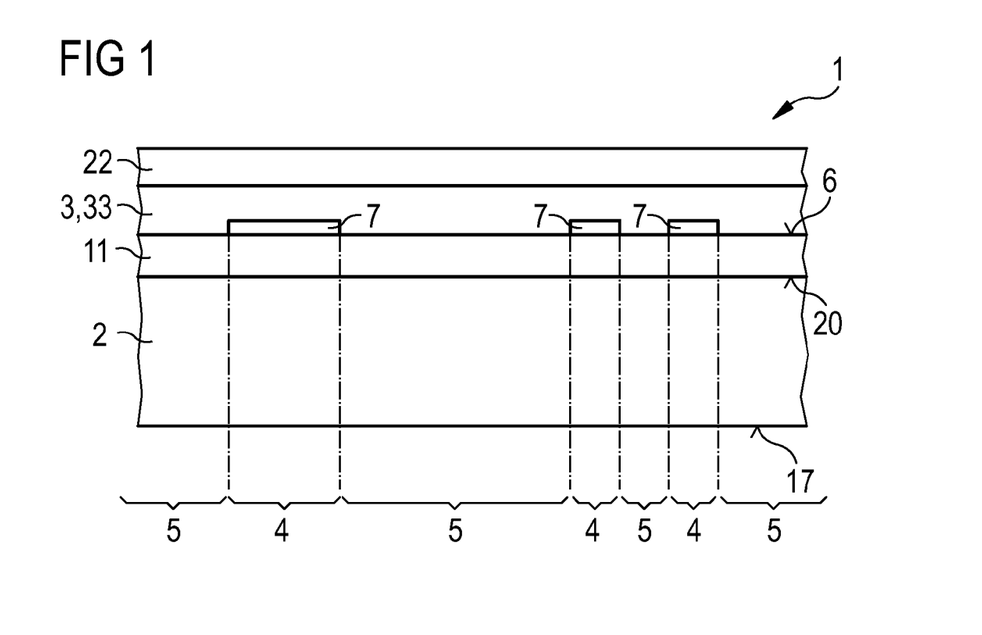
FIG. 1 is a schematic sectional representation of an exemplary embodiment of an organic optoelectronic component described herein.

FIG. 1 shows an exemplary embodiment of an organic optoelectronic component 1. A first electrode 11 is applied to a major side 20 of a carrier 2. An organic layer sequence 3 with an organic active layer 33 is applied to a major face 6 of the first electrode 11 remote from the carrier 2. A second electrode 22 is located on a side of the organic layer sequence 3 remote from the carrier 2. When the component 1 is in operation the organic layer sequence 3 is thus energised via the first electrode 11 and the second electrode 22. Electromagnetic radiation, preferably in the visible or near ultraviolet spectral range, is generated in the organic layer sequence 33 when the component 1 is in operation.

The carrier 2 for example is formed with glass or with a glass film. The first electrode 11 consists for example of indium-tin oxide or indium-zinc oxide. The thickness of the carrier 2, in a direction perpendicular to the major side 20 of the carrier 2, amounts for example to between 200 µm and 2 mm inclusive. The thickness of the first electrode 11 amounts for example to between 50 nm and 200 nm inclusive, in particular around 120 nm. The refractive index of the material of the first electrode 11 is in particular between 1.7 and 1.8 inclusive. The refractive index of the material of the carrier 2 amounts to between approx 1.45 and 1.55. The organic layer sequence 3 exhibits a thickness of the order of 100 nm. The thickness of the second electrode 22, which takes the form for example of a vapour-deposited metal or of a steel foil, is preferably in the range from 20 nm to 500 µm.

A monolayer 7 is applied in places to the major side 6 of the first electrode 11. The monolayer 7 consists of self-assembling molecules. For example, the monolayer 7 is applied to the major face 6 by a printing method. The thickness of the monolayer 7, in a direction perpendicular to the major face 6 of the first electrode 11, amounts in particular to between 0.5 nm and 5.0 nm. The thickness of the monolayer 7 is thus preferably a multiple less than the thickness of the organic layer sequence 3. The monolayer 7 is electrically insulating and optically transparent.

Since the organic layer sequence 3 exhibits only negligible electrical transverse conductivity in a direction parallel to the major face 6 of the first electrode 11, the organic active layer 33 is energised only in those regions in which no monolayer 7 has been applied to the first electrode 11. Those regions in which the monolayer 7 has been applied thus constitute dark regions 4. The regions in which no monolayer 7 has been applied form bright regions 5. When the organic component 1 is in operation, the dark regions 4 are thus markedly darker than the bright regions 5. Virtually no electromagnetic radiation is generated in the dark regions 4 of the active layer 33 when the component 1 is in operation.

In the case of the component 1, the first electrode 11, the organic layer sequence 3 and the second electrode 22 thus do not differ from one another with regard to their configuration in the dark regions 4 and in the bright regions 5. In particular because the first electrode 11 substantially covers the entire major side 20 of the carrier 2, when the component 1 is not in operation a pattern of the bright regions 5 and dark regions 4 formed by the monolayer 7 is not discernible. Since the first electrode 11 exhibits a refractive index which is markedly different from the carrier 2 and thus exhibits a different reflection behaviour, in the case of a first electrode 11 which had for example been removed in the dark regions 4 the pattern formed by the dark regions 4 and by the bright regions 5 would be discernible when the component 1 was not in operation.

Radiation generated in the organic layer sequence 33 leaves the component 1 through the carrier 2. A major side of the carrier 2 remote from the first electrode 11 here forms a radiation passage face 17. The second electrode 22 is preferably reflective and/or opaque with regard to the radiation generated in the organic layer sequence 3.

In other words, the bright regions 4 and the dark regions 5 are indistinguishable from one another when the component 1 is not in operation and when looking at the radiation passage face 17. If the second electrode 22 is opaque, this means that a first reflectivity of the bright regions 4 is virtually not different from a second reflectivity of the dark regions 5.

Figure 2:
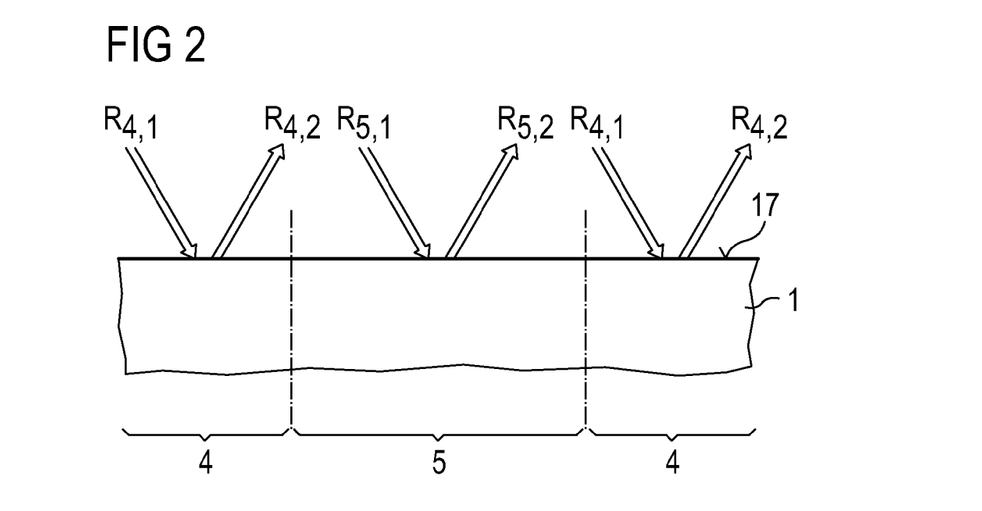
FIG. 2 is a schematic illustration of determination of the reflectivity of bright regions and dark regions.

The first and second reflectivities are explained in greater detail in relation to FIG. 2. The reflectivities may be determined by determining the power of a radiation $R_{4,1}$, $R_{5,1}$ directed onto the radiation passage face 17 and a radiant power of a radiation $R_{4,2}$, $R_{5,2}$ reflected at the radiation passage face 17 in the at least one bright region 4 and in the at least one dark region 5 and comparing them with one another. The first reflectivity of the dark regions 4 is then the quotient of the radiant powers $R_{4,2}$ and $R_{4,1}$. The second reflectivity of the bright region 5 is accordingly the quotient of the radiant powers $R_{5,2}$ and $R_{5,1}$.

For example, the first and second reflectivities do not or virtually do not differ from one another in the visible spectral range, i.e. in particular between 480 nm and 640 nm, and in an incident angle range of between 0° and 70° inclusive.

If the component 1 is transparent or radiation-transmissive, transmission values of the component 1 may be determined in a similar manner in the dark regions 4 and in the bright regions 5 as an alternative or in addition to the first reflectivity and the second reflectivity and compared with one another. Preferably, the transmission values in the dark regions 4 and in the bright regions 5 and preferably also the reflectivities thereof do not or virtually do not then differ from one another.

The fact that the dark regions 4 and the bright regions 5 are not visually distinguishable from outside the component 1 when the component is not in operation is thus in summary in particular the consequence of the first electrode 11 spanning both the dark regions 4 and the bright regions 5, and of the monolayer 7 not or not significantly influencing the reflectivity, the absorption and/or the transmission of radiation at or through the component 1.

Figure 3:
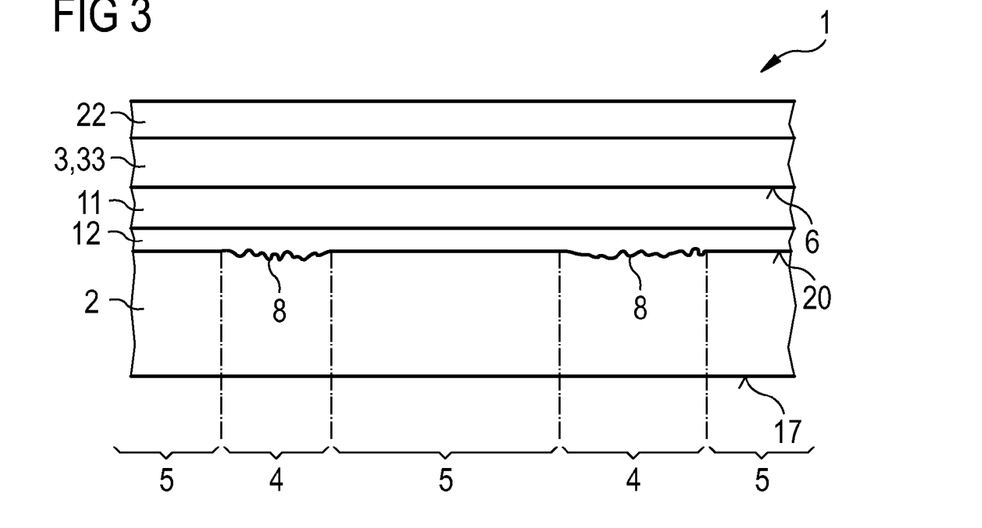
FIGS. 3 to 4 are schematic sectional representations of further exemplary embodiments of organic components described herein.

A further exemplary embodiment of the component 1 is shown in FIG. 3. An interlayer 12, consisting for example of silicon dioxide, is mounted between the first electrode 11 and the carrier 2. The thickness of the interlayer 12, in a direction perpendicular to the major face 6 of the first electrode 11, amounts for example to around 20 nm.

In the dark regions 4 the major side 20 of the carrier 2 exhibits roughening 8. The roughening 8 is covered by the interlayer 12. A major side of the interlayer 12 remote from the carrier 2 is virtually smooth. In other words the interlayer 12 may completely or partly smooth out the roughening 8 on the carrier 2.

The first electrode 11, the second electrode 22 and the organic layer sequence 3 are thus applied uniformly everywhere over the major side 20 of the carrier 2 within the bounds of manufacturing tolerances. In the lateral direction radiation is generated in the entire organic layer sequence 3 when the component 1 is in operation. The roughening 8 effects the deflection of light away from the dark regions 4 towards the bright regions 5. In this way, an average radiant power per unit area, which leaves the component 1 at the radiation passage face 17, is for example 50% lower in the dark regions 4 than in the bright regions 5. The roughening 8 has virtually no effect on the reflectivity of the radiation passage face and the first electrode 11. When the component 1 is not in operation, the dark regions 4 are thus indistinguishable from the bright regions 5, when looking at the radiation passage face 17.

The average roughness of the roughening 8 is for example between 20 nm and 500 nm inclusive. The roughening may be achieved for instance by laser irradiation of the major side 20 of the carrier 2 or by grinding the major side 20 with an abrasive of a defined grain size. The roughening 8 may be isotropic with regard to main directions of extension of the carrier 2 or indeed for example take the form of approximately parallel channels of an average depth corresponding to the roughness.

Figure 4:
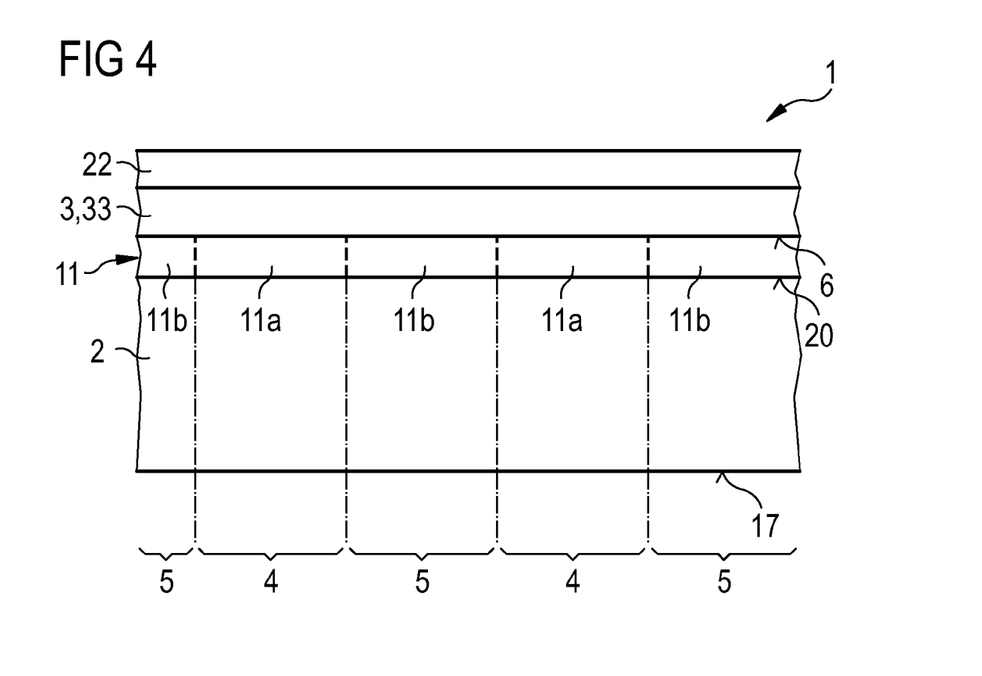

In the exemplary embodiment according to FIG. 4 the first electrode 11a, 11b is again a continuous layer over the major face 20 of the carrier 2. However, the major face 6 of the first electrode 11a, 11b exhibits a higher work function in the dark regions 4 than in the bright regions 5. Thus, in the dark regions 4 fewer charge carriers are injected into the organic layer sequence than in the bright regions 5. This makes the dark regions 4 appear darker, since when the component 1 is in operation less radiation is generated in the dark regions 4. When the component 1 is not in operation, the dark regions 4 cannot be distinguished from the bright regions 5 with the naked eye, when looking at the radiation passage face 17.

The work function at the major face 6 of the first electrode 11b in the bright regions 5 and of the first electrode 11a in the dark regions 4 may be measured for example by removing the second electrode 22 and the active layer sequence from the first electrode 11, wherein the major face 6 of the first electrode 11a, 11b is virtually unchanged. The work function may then be measured locally for instance using photoelectron emission spectroscopy.

In the exemplary embodiments according to FIGS. 1 and 4 an interlayer 12, not shown in FIGS. 1 and 4, may optionally also be applied between the first electrode 11 and the carrier 2.

FIG. 5 illustrates a method of producing an organic optoelectronic component, for example according to FIG. 4.

Figure 5A:
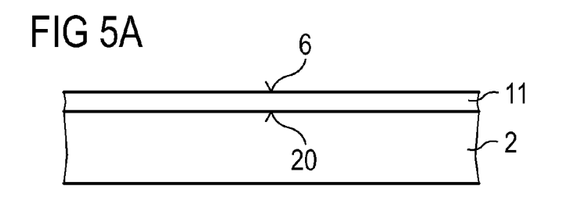
FIG. 5 is a schematic representation of an exemplary embodiment of a method described herein for producing an organic optoelectronic component described herein.

In one method step, see FIG. 5A, the first electrode 11 is applied to the major side 20 of the carrier 2. The first electrode 11 consists for example of indium-tin oxide, ITO for short.

Figure 5B:
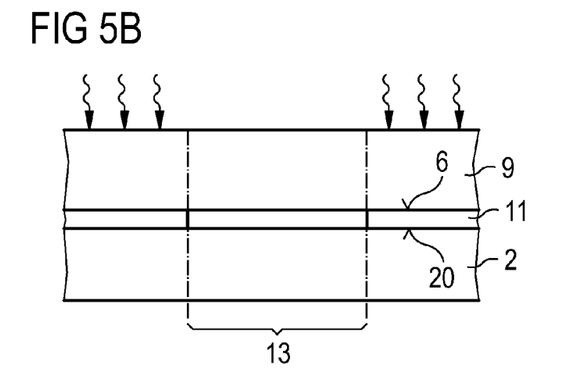

FIG. 5B shows that a photosensitive material 9 is applied to a major face 6 of the first electrode 11 and in particular also developed. The thickness of the photosensitive material 9 amounts to around 2 μm. The photosensitive material 9 is preferably a positive resist, i.e. the photosensitive material 9 is at least in part destroyed or made soluble for specific solvents by exposure, in particular after development.

The photosensitive material is for example AZ 1518 or OCG 825. The developer for the photosensitive material is for example MIF 350. Exposure proceeds preferably using unfiltered ultraviolet radiation from an Hg high pressure lamp or an HgXe high pressure lamp with a radiant power of around 4 mW/cm$^2$ and an exposure period of around 20 s. Exposure proceeds for example only outside a zone 13 of the first electrode 11. In FIG. 5B exposure is illustrated by arrows.

Figure 5C:
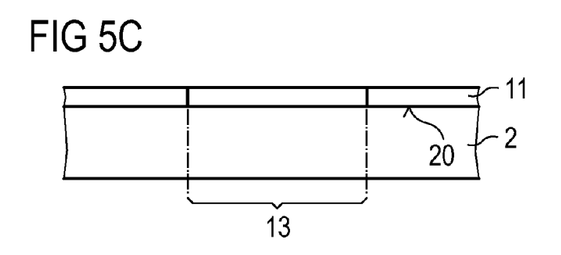

As shown in FIG. 5C, the photosensitive material 9 is then removed. On removal of the photosensitive material 9, no or no significant material removal takes place with regard to the first electrode 11. In other words, the thickness of the first electrode 11, in a direction perpendicular to the major side 20 of the carrier 2, is not affected by the removal of the photosensitive material 9. Removal takes place preferably by ashing with an oxygen plasma and by rinsing with a solvent, for example a glycol ester.

Figure 5D:
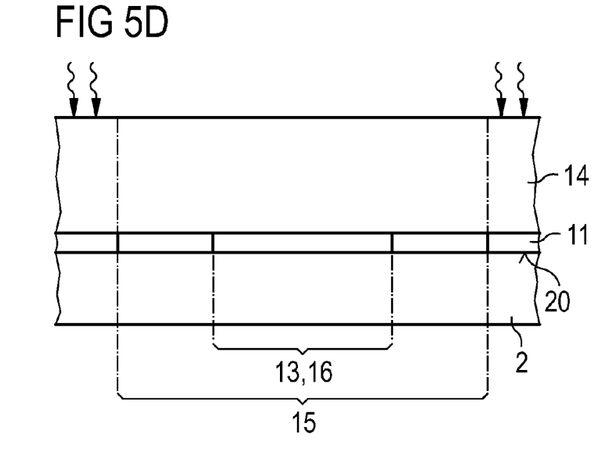

A further photosensitive material 14 is additionally applied to the first electrode 11, see FIG. 5D, and preferably also developed. The further photosensitive material 14 may also be a positive resist. The further photosensitive material 14 is also exposed apart from in a sub-region 15, as illustrated by arrows. It is optionally also possible for the zone 13 and/or the sub-region 15 to include the entire major face 20 of the carrier 2, wherein exposure of the further photosensitive material 14 may then be omitted, just as may exposure of the photosensitive material 9.

The zone 13 of the first electrode 11, outside which exposure of the photosensitive material 9 has already taken place, is completely or partially enclosed by the sub-region 15. The region in which the sub-region 15 and the zone 13 overlap constitutes an overlap region 16. In the overlap region 16 the photosensitive materials 9, 14 have thus each been developed, but not exposed.

Figure 5E:
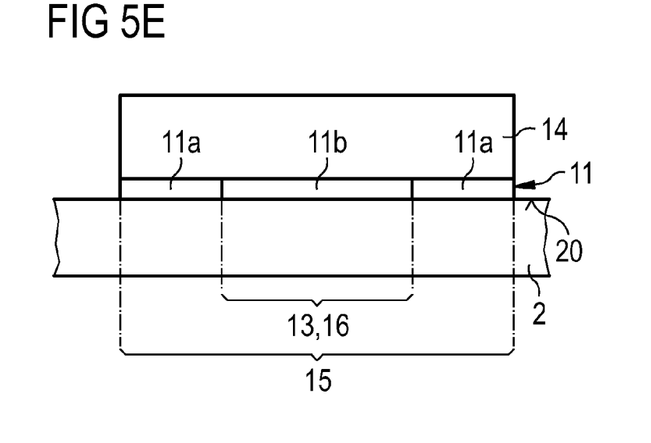

In a further, optional method step, see FIG. 5E, the further photosensitive material is removed apart from in the sub-region 15. Furthermore, the first electrode 11 may be removed apart from in the sub-region 15. In other words, patterning of the first electrode 11 is achieved by removing a material of the first electrode 11. In particular, the major side 20 of the carrier 2 is completely bare, at least in places.

Figure 5F:
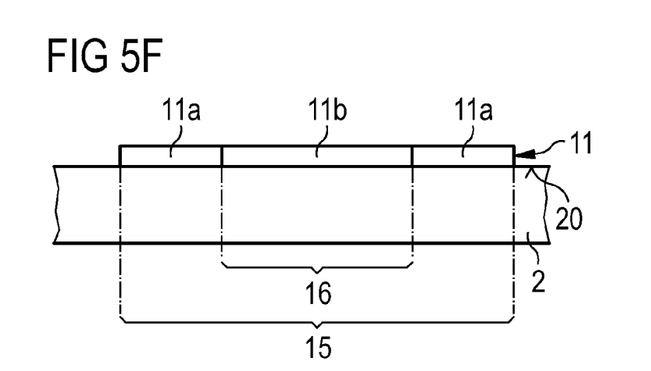

As FIG. 5F shows, the further photosensitive material 14 is then removed, without modifying the thickness of the first electrode 11 in the sub-region 15.

By developing the photosensitive materials 9, 14 twice, and removing them twice, the work function of the first electrode 11b is decreased at the major face 6 in the overlap region 16 compared with the first electrode 11a outside the overlap region 16.

Figure 5G:
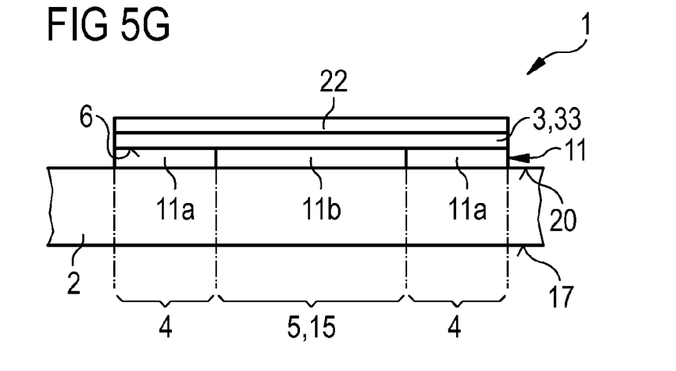

Finally, the component 1 is finished, see FIG. 5G, the organic layer sequence 3 with the at least one active layer 33 and the second electrode 22 being applied at this point. Application may here be effected only over the first electrode 11 or, unlike what is shown in FIG. 5G, also over the entire surface.

It is optionally possible for further layers, not shown in FIG. 5G, to be applied, for example for encapsulation of the component 1 and in particular of the organic layer sequence 3. It is furthermore optionally possible for an antireflective layer for example to be applied to the radiation passage face 17.

The invention described herein is not restricted by the description given with reference to the exemplary embodiments. Rather, the invention encompasses any novel feature and any combination of features, including in particular any combination of features in the claims, even if this feature or this combination is not itself explicitly indicated in the claims or exemplary embodiments.

The invention claimed is:

1. A method of producing an organic optoelectronic component comprising steps of:
   providing a carrier with a first electrode;
   applying a first photosensitive material to the first electrode on a main side of the carrier and exposing the first photosensitive material apart from a first region of the first electrode;
   completely removing the first photosensitive material, a thickness of the first electrode remaining unchanged over a complete area where the first photosensitive material has been applied to the first electrode;
   after completely removing the first photosensitive material applying a further photosensitive material to the first electrode and exposing the further photosensitive material apart from a second region of the first electrode, the second region at least partially including the first region;
   completely removing the further photosensitive material; and
   producing an organic layer sequence with at least one organic active layer, the organic layer sequence and a second electrode on the first electrode;
   wherein a work function at a major face of the first electrode remote from the carrier is decreased in at least one overlap region, in which the first region and the second region overlap, compared with other regions of the first electrode which are located outside the at least one overlap region,
   wherein between the step of exposing the further photosensitive material and the step of removing the further photosensitive material the first electrode is removed in a further step apart from the second region so that the first electrode is removed outside the second region,
   wherein at least one bright region is formed in the at least one overlap region of the first and second regions where the first photosensitive material and the further photosensitive material have been applied and subsequently removed,
   wherein at least one dark region is formed in a remaining region of the second region not belonging to the at least one bright region,
   wherein the step of exposing the first photosensitive material is performed by illuminating the first photosensitive material with a radiation to one of:
   destroy the first photosensitive material or
   make the first photosensitive material soluble,
   wherein the organic layer sequence with the at least one organic active layer is applied onto the main side of the carrier,
   wherein the second electrode is applied directly onto the organic layer sequence and the organic layer sequence is applied directly onto the first electrode, and
   wherein, both in the at least one dark region and in the at least one bright region, the first and the second electrodes and the organic layer sequence are applied to the carrier,
   wherein the first photosensitive material and the further photosensitive material are applied directly onto the first electrode.

2. The method of claim 1, wherein the first electrode is formed with or from indium-tin oxide, exposure of the first photosensitive material and the further photosensitive material is carried out with wavelengths of between 240 nm and 380 nm inclusive, and a positive photoresist is used as the first photosensitive material and the further photosensitive material and both photosensitive materials are developed in the at least one overlap region.

3. The method of claim 1, wherein a thickness of the first electrode is between 50 nm and 200 nm, and wherein the first electrode is transmissive for radiation generated in the organic optoelectronic component.

4. The method according to claim 1,
   wherein the first photosensitive material and the further photosensitive material are positive resists, wherein the step of removing the first photosensitive material takes place by ashing with an oxygen plasma and by subsequent rinsing with a glycol ester, wherein in the at least one overlap region, the first photosensitive material and the further photosensitive material are developed but not exposed, and
wherein the first electrode consists of indium-tin oxide.

\* \* \* \* \*